(12) United States Patent
Kawai

(10) Patent No.: US 10,199,515 B2
(45) Date of Patent: Feb. 5, 2019

(54) VACUUM PACKAGE, ELECTRONIC DEVICE, AND VEHICLE

(71) Applicant: Seiko Epson Corporation, Tokyo (JP)

(72) Inventor: Hiromu Kawai, Chino (JP)

(73) Assignee: Seiko Epson Corporation (JP)

( * ) Notice: Subject to any disclaimer, the term of this patent is extended or adjusted under 35 U.S.C. 154(b) by 45 days.

(21) Appl. No.: 15/619,802

(22) Filed: Jun. 12, 2017

(65) Prior Publication Data

US 2017/0365723 A1 Dec. 21, 2017

(30) Foreign Application Priority Data

Jun. 15, 2016 (JP) ................................. 2016-118614

(51) Int. Cl.
| | | |
|---|---|---|
| *H01L 31/0203* | (2014.01) | |
| *B81B 7/00* | (2006.01) | |
| *B81C 1/00* | (2006.01) | |
| *H01L 21/44* | (2006.01) | |
| *H01L 21/46* | (2006.01) | |
| *H01L 31/09* | (2006.01) | |

(52) U.S. Cl.
CPC ........ *H01L 31/0203* (2013.01); *B81B 7/0035* (2013.01); *B81C 1/00269* (2013.01); *H01L 21/44* (2013.01); *H01L 21/46* (2013.01); *H01L 31/09* (2013.01)

(58) Field of Classification Search
None
See application file for complete search history.

(56) References Cited

U.S. PATENT DOCUMENTS

| | | | |
|---|---|---|---|
| 6,534,850 B2 | 3/2003 | Liebeskind | |
| 7,042,075 B2 | 5/2006 | Liebeskind | |
| 2006/0183299 A1 | 8/2006 | Liebeskind | |
| 2017/0365723 A1* | 12/2017 | Kawai | ................... B81B 7/0035 |

FOREIGN PATENT DOCUMENTS

| | | |
|---|---|---|
| JP | 2002-352700 A | 12/2002 |
| JP | 2005-098872 A | 4/2005 |
| JP | 2006-513046 A | 4/2006 |
| JP | 2007-012557 A | 1/2007 |
| JP | 2008-145134 A | 6/2008 |
| JP | 2012-177579 A | 9/2012 |
| WO | WO-2004-065289 A2 | 8/2004 |

\* cited by examiner

*Primary Examiner* — Jack Chen
(74) *Attorney, Agent, or Firm* — Harness, Dickey & Pierce, P.L.C.

(57) ABSTRACT

A vacuum package includes a substrate, a pair of through electrodes that penetrates the substrate, each of the pair of the trough electrodes having first end portion, and a getter that is joined to the first end portions of the pair of the through electrodes, and is heated by electronic conduction via the pair of the through electrodes A portion of the getter between the through electrodes is spaced apart from the substrate.

10 Claims, 12 Drawing Sheets

| CHARACTER-ISTIC ITEM | CHARACTERISTIC VALUE |
|---|---|
| $l_e$ | 0.75mm |
| $\lambda_e$ | 400W/mK |
| $A_e$ | $7.9 \times 10^{-1} mm^2$ |
| $l_G$ | 5mm |
| $\lambda_G$ | 13W/mK |
| $A_G$ | $7.5 \times 10^{-2} mm^2$ |

VACUUM PACKAGE, ELECTRONIC DEVICE, AND VEHICLE

CROSS-REFERENCE TO RELATED APPLICATION

This application claims priority to Japanese Patent Application No. 2016-118614, filed Jun. 15, 2016, the entirety of which is hereby incorporated by reference.

BACKGROUND

1. Technical Field

Various embodiments of the present invention relates to a vacuum package, an electronic device including the vacuum package, and a vehicle.

2. Related Art

In the related art, as an electronic device including a vacuum package, a micro mechanical device or a micro optoelectronic device, which includes a getter substance and a heater member for heating the getter substance within a device body (corresponding to a vacuum package) which is airtightly configured, and in which electrical contacts of the heater member are electrically connected to an outside, is known (for example, see JP-T-2006-513046).

In the device described above, since the getter substance and the heater member for heating the getter substance are fixed so as to be in direct contact with a base of the device body, heat of the heater member is easily transferred to another member mounted on the base by heat conduction via the base.

Therefore, in a case where the other member is sensitive to heat, the device needs to extremely increase a distance from the getter substance and the heater member to the other member in order to reduce an influence of heat of the getter substance and the heater member.

As a result, there is a concern that downsizing of an external size of the device can be difficult.

SUMMARY

An advantage of some aspects of the invention is to solve at least a part of the problems described above, and the advantage can be achieved by the following forms or application examples.

Application Example 1

A vacuum package according to this application example includes a substrate; a pair of through electrodes that penetrates the substrate; a getter that is installed between the pair of through electrodes; and a lid that covers the pair of through electrodes and the getter on the substrate. The lid is airtightly joined to the substrate and an internal space defined by the substrate and the lid is in a reduced pressure state. The pair of through electrodes has first end portions on an internal space side and second end portions on a side opposite to the first end portions. The getter is joined to the first end portions of the pair of through electrodes and is heated by electric conduction via the through electrodes. A portion of the getter between the through electrodes is spaced apart from the substrate.

According to this application example, in the vacuum package, the getter is joined to the first end portions of the through electrodes and is heated by electric conduction via the through electrodes, and the portion of the getter between the through electrodes is spaced apart from the substrate.

Therefore, in the vacuum package, since the portion of the getter between the through electrodes is not in direct contact with the substrate, heat generated during heating the getter is less transferred to, for example, an element (corresponding to another member) mounting area on the substrate than in the related art (for example, JP-T-2006-513046, hereinafter the same).

As a result, in the vacuum package, in a case where heat sensitivity of the element to be mounted is the same, a distance between the getter and the element mounting area can be made smaller than that of the related art. Therefore, an external size can be reduced.

Application Example 2

In the vacuum package according to the application example, it is preferable that the first end portions of the through electrodes protrude from the substrate to the internal space side.

According to this application example, in the vacuum package, the first end portions of the through electrodes protrude from the substrate to the internal space side so that the getter is not in direct contact with the substrate. Therefore, heat generated during heating the getter is less transferred to, for example, the element mounting area on the substrate than in the related art.

As a result, in the vacuum package, in a case where heat sensitivity of the element to be mounted is the same, the distance between the getter and the element mounting area can be made smaller than that of the related art. Therefore, the external size can be reduced.

Application Example 3

In the vacuum package according to the application example, it is preferable that the through electrode is configured to include a conductor and an insulator that covers a periphery of the conductor in a plan view, and thermal conductivity of the insulator is greater than thermal conductivity of the substrate.

According to this application example, in the vacuum package, the through electrode is configured to include the conductor and the insulator that covers the periphery of the conductor in a plan view, which prevents short circuits between the through electrodes during mounting on an external member and the thermal conductivity of the insulator is greater than the thermal conductivity of the substrate. Therefore, for example, it is possible to reduce a temperature difference between the first end portions and the second end portions of the through electrodes.

Therefore, in the vacuum package, for example, when heating the getter by electric conduction via the through electrodes, it is possible to accurately estimate a temperature distribution of the getter and a periphery of the getter from a temperature and an electric conduction current value at the second end portions of the through electrodes.

As a result, in the vacuum package, it is possible to reduce the distance between the getter and the element mounting area more than that in a case where the temperature distribution of the periphery of the getter cannot be accurately estimated. Therefore, the external size can be reduced.

Application Example 4

In the vacuum package according to the application example, it is preferable that at least one of the through electrode and the substrate has a stepped portion in an engaging portion between the through electrode and the substrate.

According to this application example, in the vacuum package, at least one of the through electrode and the substrate has the stepped portion in the engaging portion between the through electrode and the substrate. Therefore, it is possible to reliably perform positioning and falling prevention of the through electrode in the penetration direction.

Application Example 5

In the vacuum package according to the application example, it is preferable that the through electrode has a configuration in which end surfaces of the second end portions are flush with a surface of the substrate on an external space side.

According to this application example, in the vacuum package, the end surfaces of the second end portions of the through electrode are flush with the surface of the substrate on the external space side. Therefore, for example, electric conduction work to the getter via the through electrode becomes easy.

Application Example 6

In the vacuum package according to the application example, it is preferable that the thermal conductivity of the substrate is smaller than the thermal conductivity of the through electrode.

According to this application example, in the vacuum package, the thermal conductivity of the substrate is smaller than the thermal conductivity of the through electrode. Therefore, when heating the getter by electric conduction via the through electrode, even if the temperature of the through electrode is high, it is possible to suppress transfer of the heat to the periphery thereof.

Application Example 7

In the vacuum package according to the application example, it is preferable that the getter has a base material and an absorbent material that covers at least a part of the base material. It is preferable that when a thickness of the through electrode in a substrate penetration direction is $l_e$, the thermal conductivity of the through electrode is $\lambda_e$, an average sectional area of the through electrode in a plane perpendicular to the penetration direction is $A_e$, a length of an electric conduction portion of the getter is $l_G$, a thermal conductivity of the base material of the getter is $\lambda_G$, and an average sectional area of the getter in a plane perpendicular to an electric conduction direction is $A_G$, and when the getter is heated by electric conduction via the through electrodes, the following expression is satisfied.

$$l_e/\lambda_e A_e < 1/N \times 1/2 \times l_G/2/\lambda_G A_G \text{ (here, } N \text{ is a real number)}$$

According to this application example, in the vacuum package, when heating the getter by electric conduction via the through electrodes, $l_e/\lambda_e A_e$ that is the temperature difference within the through electrode generated per unit heat disssipation amount and $1/2 \times l_G/2/\lambda_G A_G$ that is a temperature difference between the end portions and a center portion of the getter generated per unit heat disssipation amount are in a relationship of the expression described above.

Therefore, in the vacuum package, it is possible to accurately estimate the temperature distribution of the getter and the periphery of the getter by the temperature and the electric conduction current value at the second end portions of the through electrodes when heating the getter.

As a result, in the vacuum package, it is possible to reduce the distance between the getter and the element mounting area more than that in a case where the temperature distribution of the periphery of the getter cannot be accurately estimated. Therefore, the external size can be reduced.

Application Example 8

In the vacuum package according to the application example, it is preferable that the N is 30.

According to this application example, in the vacuum package, since the N in the above expression is 30, it is possible to estimate the temperature distribution of the getter and the periphery of the getter more actually, that is, accurately by the temperature and the electric conduction current value at the second end portions of the through electrodes when heating the getter.

Application Example 9

An electronic device according to this application example includes the vacuum package according to any one of the application examples; and an element that is mounted on the substrate of the vacuum package.

According to this application example, the electronic device includes the vacuum package according to any one of the application examples and the element that is mounted on the substrate of the vacuum package. Therefore, the effects described in any one of the application examples are exhibited and excellent performance can be exhibited.

Application Example 10

An electronic apparatus according to this application example includes the electronic device according to the application example.

According to this application example, the electronic apparatus includes the electronic device according to the application example. Therefore, the effects described in the application example are exhibited and excellent performance can be exhibited.

Application Example 11

A vehicle according to this application example includes the electronic device according to the application example.

According to this application example, the vehicle includes the electronic device according to the application example. Therefore, the effects described in the application example are exhibited and excellent performance can be exhibited.

BRIEF DESCRIPTION OF THE DRAWINGS

Various embodiments of the invention will be described with reference to the accompanying drawings, wherein like numbers reference like elements.

DESCRIPTION OF EXEMPLARY EMBODIMENTS

Hereinafter, embodiments will be described with reference to the drawings in detail. The embodiments described below do not unduly limit the contents of the invention described in the appended claims. Also, not all of the configurations described below are necessarily essential configuration elements of the invention.

First Embodiment

A vacuum package of a first embodiment will be described.

Figure 1:
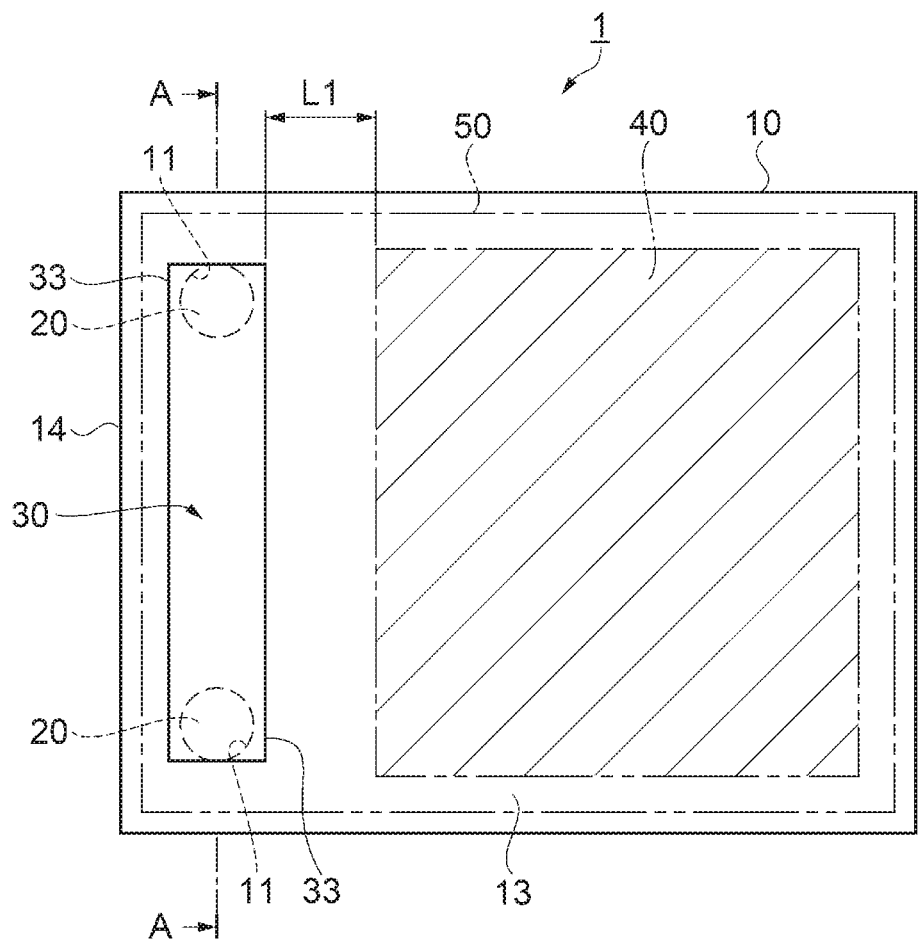
FIG. 1 is a schematic view illustrating a schematic configuration of a vacuum package of a first embodiment and is a plan view in which the vacuum package is viewed from above the same package.
Figure 2:
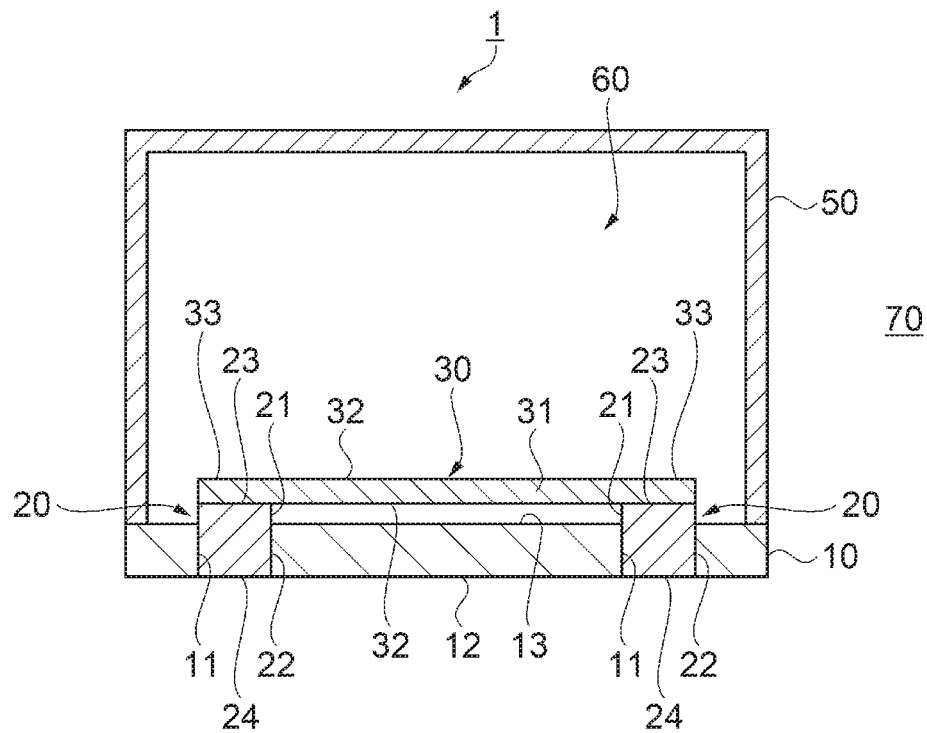
FIG. 2 is a sectional view that is taken along line A-A of FIG. 1.
Figures 3, 4:
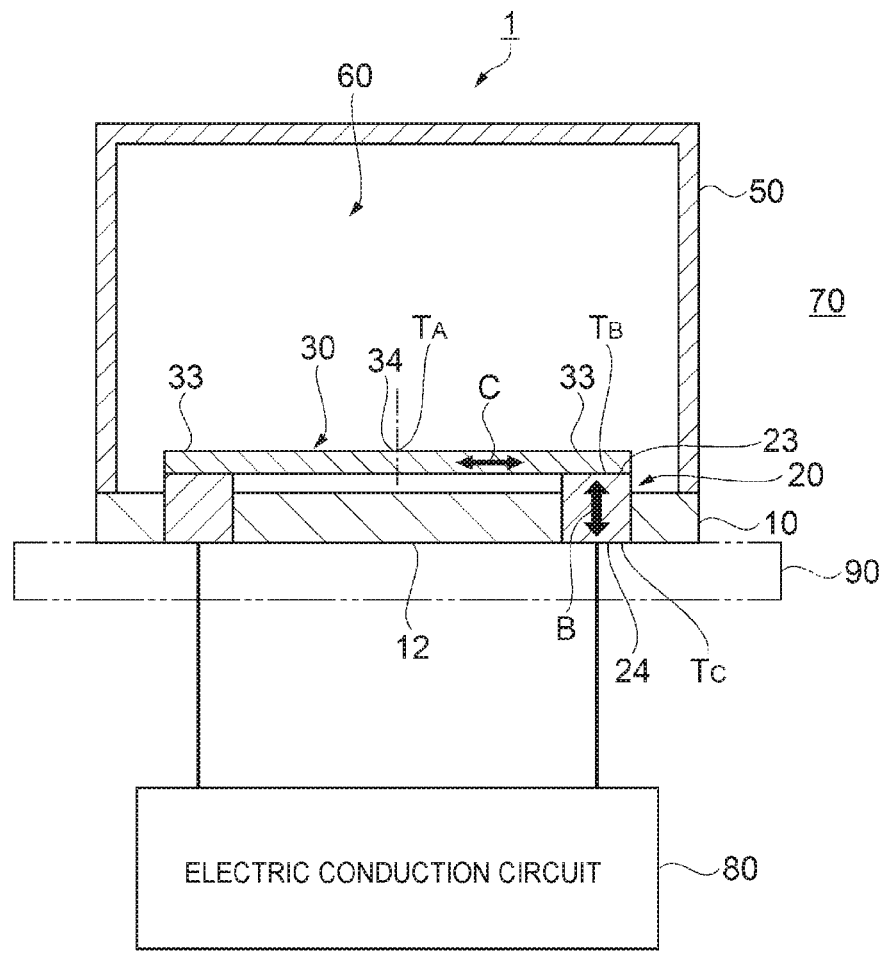
FIG. 3 is a schematic sectional view for explaining a relationship between configuration elements and a temperature, and the like during electric conduction heating.
FIG. 4 is a diagram for explaining a calculation result of each characteristic value.

FIG. 1 is a schematic view illustrating a schematic configuration of the vacuum package of the first embodiment and is a plan view in which the vacuum package is viewed from above the same package. FIG. 2 is a sectional view that is taken along line A-A of FIG. 1. FIG. 3 is a schematic sectional view for explaining a relationship between configuration elements and a temperature during electric conduction heating. In each subsequent drawing including FIGS. 1 to 3, some configuration elements will be omitted in a plan view for the sake of convenience. In each drawing, a dimensional ratio of each configuration element is different from an actual size for the sake of clarity.

As illustrated in FIGS. 1 and 2, a vacuum package 1 of the first embodiment includes a substrate 10, at least a pair of through electrodes 20 penetrating the substrate 10, a getter 30 installed between the pair of through electrodes 20, an element mounting area 40 provided on the substrate 10, and a lid 50 covering the pair of through electrodes 20, the getter 30, and the element mounting area 40 on the substrate 10.

The lid 50 is airtightly joined to the substrate 10 and an internal space 60 defined by the substrate 10 and the lid 50 (here, also including a joining portion between the substrate 10 and the lid 50) is in a reduced pressure state.

The through electrode 20 has a first end portion 21 on an internal space 60 side and a second end portion 22 on a side (external space 70 side) opposite to the first end portion 21.

The getter 30 is configured such that both end portions 33 are joined to the first end portions 21 of the through electrodes 20 and is heated by electric conduction via the through electrodes 20.

The first end portion 21 of the through electrode 20 protrudes from the substrate 10 to the internal space 60.

Therefore, a portion of the getter 30 between the through electrodes 20 is spaced apart from the substrate 10 (in other words, the vacuum package 1 has a gap between the getter 30 and the substrate 10).

Hereinafter, each configuration element will be described in detail.

Substrate

The substrate 10 is formed in a substantially rectangular flat plate shape. The substrate 10 is provided with a pair of through holes 11 at one end portion (left side of a paper surface of FIG. 1) to dispose a pair of through electrodes 20. A pair of through holes 11 penetrates the substrate 10 in a thickness direction.

A material of the substrate 10 is not particularly limited, but ceramics (for example, alumina (thermal conductivity: substantially 20 to 40 W/mK)), silicon (thermal conductivity: substantially 160 to 170 W/mK), glass (thermal conductivity: substantially 1 W/mK), and the like are given as examples.

It is preferable that the thermal conductivity of the material of the substrate 10 is smaller than the thermal conductivity of a material of the through electrode 20 which is described below.

In the embodiment, a configuration, in which the material of the substrate 10 is alumina, is illustrated.

Through Electrode

The through electrode 20 is formed in a substantially columnar shape and has the first end portion 21 on the internal space 60 side and the second end portion 22 on the side opposite to the first end portion 21.

An end surface 23 of the first end portion 21 and an end surface 24 of the second end portion 22 are formed so as to be substantially parallel to each other.

The through electrode 20 is inserted into the through hole 11 of the substrate 10 and is airtightly fixed so that the first end portion 21 protrudes from the substrate 10 to the internal space 60 side.

In this case, it is preferable that the end surface 24 of the second end portion 22 of the through electrode 20 is flush with a surface 12 of the substrate 10 on the external space 70 side (in other words, the end surface 24 and the surface 12 are in the same plane).

The material of the through electrode 20 is not particularly limited, but copper (thermal conductivity: substantially 400 W/mK and electric resistivity: substantially $1.7 \times 10^{-2} \mu \Omega m$), aluminum (thermal conductivity: substantially 240 W/mK and electric resistivity: substantially $2.7 \times 10^{-2} \mu \Omega m$) which have relatively high thermal conductivity and relatively low electric resistivity, and the like are given as examples.

In the embodiment, a configuration, in which the material of the through electrode 20 is copper, is illustrated.

The shape of the through electrode 20 is not limited to a substantially columnar shape and may be a substantially prismatic shape, or the like.

Getter

The getter 30 is a non-evaporation type gas adsorption member and has a base material 31 formed in a substantially rectangular shape (elongated rectangular flat plate shape) and an absorbent material 32 covering (here, covering front and back surfaces of the base material 31 like a film) at least a part of the base material 31.

The both end portions 33 of the getter 30 are respectively joined to the end surfaces 23 of the first end portions 21 of the through electrodes 20, for example, by using a joining method with small electric resistance such as resistance welding, laser welding, and brazing material or silver paste joining.

A longitudinal direction of the getter 30 is disposed so as to be along a side 14 of the substrate 10 located in the vicinity thereof.

The vacuum package 1 is configured such that the getter 30 is joined to the end surfaces 23 of the first end portions 21 of the through electrodes 20 protruding from the substrate 10 to the internal space 60 side. Therefore, a gap (space) is provided between the getter 30 and the substrate 10. In other words, the vacuum package 1 is configured such that the portion of the getter 30 between the through electrodes 20 is spaced apart from the substrate 10.

The base material 31 generates heat due to electric conduction via the through electrodes 20 and the absorbent material 32 is heated to, for example, substantially 300° C. to 400° C., and thereby the getter 30 is activated and a gas component (for example, hydrogen gas, oxygen gas, carbon gas, nitrogen gas, mixed gas thereof, or the like) of the internal space 60 is absorbed.

Therefore, the internal space 60 of the vacuum package 1 is stably maintained in a predetermined reduced pressure state.

A material of the base material 31 of the getter 30 is not particularly limited, but nichrome (thermal conductivity: substantially 13 W/mK and electric resistivity: 1.5 $\mu \Omega m$) which has relatively low thermal conductivity and relatively high electric resistivity, and the like are given as examples.

A material of the absorbent material 32 of the getter is not particularly limited, but titanium, zirconium, vanadium, iron, alloys thereof, and the like are given as examples.

In the embodiment, a configuration, in which as the material of the base material 31 of the getter 30, nichrome is used and as the material of the absorbent material 32, a particulate (powdery) alloy mainly composed of titanium is used, is illustrated. In addition, the absorbent material 32 is sintered to the base material 31.

Element Mounting Area

The element mounting area 40 is a mounting area of an element (for example, a vibration element, an atomic oscillator element, an infrared sensor element, or the like) having relatively sensitive to heat, which is provided on a surface 13 of the substrate 10 on the internal space 60 side.

In a case where elements mounted on the element mounting area 40 are the same, an external size of the vacuum package 1 depends on a distance L1 between the element mounting area 40 and the getter 30.

Lid

The lid 50 is formed in a substantially box-shaped cap shape and covers the through electrodes 20, the getter 30, and the element mounting area 40 on the substrate 10. Moreover, an inner contour of the lid 50 is indicated by a two-dotted chain line in FIG. 1.

The lid 50 is airtightly joined to the substrate 10 by using a joining member (not illustrated) such as a low melting point glass, a brazing material, or an adhesive in a predetermined reduced pressure atmosphere.

Therefore, the internal space 60 defined by the substrate 10 and the lid 50 (joining member) is in a predetermined reduced pressure state.

A material of the lid 50 is not particularly limited, but metal such as stainless steel, kovar, 42 alloy, or ceramics, and the like are given as examples.

In the embodiment, a configuration, in which as the material of the lid 50, stainless steel is used, is illustrated.

In the vacuum package 1, the substrate 10 may be formed in a box shape and the lid 50 may be formed in a flat plate shape, or both of them may be in a box shape.

Here, in the vacuum package 1, in order to extremely shorten the distance L1 between the element mounting area 40 and the getter 30 and to reduce the external size, it is necessary to accurately estimate a temperature distribution of the getter 30 and a periphery of the getter 30. That is, in the vacuum package 1, if the temperature distribution can be accurately estimated, it is possible to reduce a margin at the distance L1 and to shorten the distance L1.

Therefore, as illustrated in FIG. 3, when the getter 30 is heated by electric conduction via the through electrodes 20 by an electric conduction circuit 80, it is preferable that a temperature difference $\Delta T_{AB}$ between a temperature $T_A$ of a center portion 34 of the getter 30 and a temperature $T_B$ of a joining portion in an end portion 33 of the getter 30 with the end surface 23 of the through electrode 20 is extremely large ($T_A \gg T_B$), and a temperature difference $\Delta T_{BC}$ between the temperature $T_B$ and a temperature $T_C$ of the end surface 24 of the through electrode 20 is extremely small ($T_B \cong T_C$).

Specifically, in the vacuum package 1, it is preferable that when a thickness of the through electrode 20 in a penetration direction (arrow B direction) of the substrate 10 is le, the thermal conductivity of the through electrode 20 is $\lambda e$, an average sectional area of the through electrode 20 in a plane perpendicular to the penetration direction (arrow B direction) is Ae, a length of an electric conduction portion (portion not being in contact with the through electrode 20) of the getter 30 is $l_G$, a thermal conductivity of the base material 31 of the getter 30 is $\lambda_G$, and an average sectional area of the getter 30 in a plane perpendicular to an electric conduction direction (arrow C direction) is $A_G$, the following expression (1) is satisfied.

$$le/\lambda e Ae < 1/N \times 1/2 \times l_G/2/\lambda_G A_G \text{ (here, } N \text{ is a real number)} \quad (1)$$

In the above expression (1), $le/\lambda e Ae$ indicates the temperature difference $\Delta T_{BC}$ between the end surface 23 (temperature $T_B$) and the end surface 24 (temperature $T_C$) of the through electrodes 20 generated per unit heat disssipation amount, and $1/2 \times l_G/2/\lambda_G A_G$ indicates the temperature difference $\Delta T_{AB}$ between the end portion 33 (temperature $T_B$) and the center portion 34 (temperature $T_A$) of the getter 30 generated per unit heat disssipation amount.

In addition, the temperature $T_C$ is obtained by a temperature measuring device (not illustrated) such as a thermocouple by being in contact with the end surface 24 of the through electrode 20.

Concept of Derivation of Expression (1)

In order to decrease the temperature difference $\Delta T_{BC}$ between the temperature $T_B$ and the temperature $T_C$ and to increase analysis accuracy of an internal temperature of the vacuum package 1 while maintaining the temperature difference $\Delta T_{AB}$ between the temperature $T_A$ and the temperature $T_B$, it is required to design to satisfy the following expression (2) with respect to the temperature differences $\Delta T_{AB}$ and $\Delta T_{BC}$.

$$\Delta T_{BC} < 1/N \times \Delta T_{AB} \quad (2)$$

Regarding a flow of heat in the through electrode 20, if heat transfer to surrounding the substrate 10 and heat generation inside the through electrode 20 are ignored, the following expression (3) is satisfied by a Fourier's law (heat flux is proportional to a temperature gradient).

$$Je = -\lambda e \times -\Delta T_{BC}/e \quad (3)$$

Since a heat quantity Q generated in the electric conduction portion of the getter 30 is mostly dissipated through the through electrodes 20 in the vacuum package 1, the following expression (4) is satisfied.

$$Q = Je \times 2Ae \quad (4)$$

The following expression (5) is satisfied by expressions (3) and (4).

$$\Delta T_{BC} = le/\lambda e Ae \times Q/2 \quad (5)$$

In addition, $\Delta T_{AB}$ satisfies the following expression (6).

$$\Delta T_{AB} < 1/2 \times l_G/2/\lambda_G A_G \times Q/2 \quad (6)$$

When the expression (2) described above is satisfied, the following expression (7) is satisfied by expression (5) and expression (6) described above.

$$le/\lambda e Ae < 1/N \times 2\Delta T_{AB}/Q < 1/N \times 1/2 \times l_G/2/\lambda_G A_G \quad (7)$$

Therefore, it is necessary to satisfy at least the following expression (8), that is, expression (1).

$$le/\lambda e Ae < 1/N \times 1/2 \times l_G/2/\lambda_G A_G \quad \text{expression (8) ((1))}$$

In the configuration illustrated in FIGS. 1 and 2, N of the expression is set to be 30 (described in detail later).

Specifically, the vacuum package 1 has the following configuration.

(a) Alumina (thermal conductivity: 20 to 40 W/mK) having a thickness of 0.5 mm is used for the substrate 10.

(b) Columnar copper (thermal conductivity: 400 W/mK and electric resistivity: $1.7 \times 10^{-2}$ μΩm) is used for the through electrode 20, and a diameter of the through electrode 20 is 1 mm and a thickness (distance from the end surface 23 to the end surface 24) of the through electrode 20 is 0.75 mm.

Therefore, a resistance value in the through electrode 20 is reduced and heat generation in the through electrode 20 is extremely suppressed.

(c) Nichrome (thermal conductivity: 13 W/mK and electric resistivity: 1.5 μΩm) having a length of 7 mm and a thickness of 0.05 mm is used for the base material 31 of the getter 30 and a thickness of the absorbent material 32 is 0.1 mm on the front and back sides of the base material 31. The getter 30 has a substantially rectangular shape and it is assumed that there is almost no change in the material or change in the sectional area between one end portion 33 and the other end portion 33.

According to the configuration, each characteristic value of the vacuum package 1 is a value as illustrated in the drawing for explaining a calculation result of each characteristic value of FIG. 4.

Therefore, in the vacuum package 1, $le/\lambda e Ae \cong 2.37$ (K/W), N=30, and $1/N \times 1/2 \times l_G/2/\lambda_G A_G \cong 42.74$ (K/W). Therefore, expression (1): $le/\lambda e Ae < 1/N \times 1/2 \times l_G/2/\lambda_G A_G$ is satisfied.

Here, in the getter 30, since an escape path of generated heat is substantially only from the joining portion with the through electrode 20, if the temperature $T_B$ of the joining portion of the getter 30 with the through electrode 20 of the vacuum package 1 and an electric conduction current value to the getter 30 are known, it is possible to estimate the temperature distribution of an entirety of the getter 30 and furthermore an entirety (internal space 60) of the inside of the vacuum package 1.

Concept of Derivation of N=30

In the vacuum package 1, in a case where the temperature of the substrate 10 is suppressed to, for example, 150° C. or less so as not to damage an element having a relatively sensitive to heat, $\Delta T_{AB}$ is necessary to be substantially 300° C. so that the temperature of the center portion 34 of the getter 30 is 400° C. or more.

On the other hand, if conditions, in which the temperature difference between the front and back surfaces (surface 13 and the surface 12) of the substrate 10 is negligibly small, are obtained, it is assumed that the measurement accuracy of the temperature measuring device such as the thermocouple is substantially ±5° C. and it is necessary $\Delta T_{BC} = 10°$ C. or less.

When substituting the conditions to expression (2), $\Delta T_{BC} = 10 < 1/N \times \Delta T_{AB} = 1/N \times 300$, and N=30.

N is changed by appropriately changing the assumed conditions.

In the vacuum package 1, when activating the getter 30, it is preferable that a temperature control device 90 configured of a Peltier element, a heater, and the like, is in contact with the surface 12 of the substrate 10 on the external space 70 side and the getter 30 is activated while controlling the temperature of the substrate 10 (in other words, while controlling the temperature on the internal space 60 side to an appropriate temperature).

The temperature control device 90 may be in contact with the lid 50 instead of the substrate 10.

As described above, in the vacuum package 1 of the first embodiment, the getter 30 is joined to the end surfaces 23 of the first end portions 21 of the through electrodes 20, is heated by electric conduction via the through electrodes 20, and the portion of the getter 30 between the through electrodes 20 is spaced apart from the substrate 10.

Therefore, in the vacuum package 1, since the portion of the getter 30 between the through electrodes 20 is not in direct contact with the substrate 10, heat generated when heating the getter 30 is unlikely to be transferred to the element mounting area 40 on the substrate 10 more than that in the related art.

As a result, in the vacuum package 1, in a case where heat sensitivity of the element to be mounted is the same, it is possible to reduce the distance L1 between the getter 30 and the element mounting area 40 more than that in the related art. Therefore, the external size can be reduced.

In the vacuum package 1, the first end portion 21 of the through electrode 20 protrudes from the substrate 10 to the internal space 60 side and thereby even if the getter 30 has a substantially rectangular shape (flat plate shape), the getter 30 is not in direct contact with the substrate 10. Therefore, heat generated when heating the getter 30 is unlikely to be transferred to the element mounting area 40 on the substrate 10 more than that in the related art.

As a result, in the vacuum package 1, in a case where heat sensitivity of the element to be mounted is the same, it is possible to reduce the distance L1 between the getter 30 and the element mounting area 40 more than that in the related art. Therefore, the external size can be reduced.

In the vacuum package 1, since the end surface 24 of the second end portion 22 of the through electrode 20 is flush with the surface 12 of the substrate 10 on the external space 70 side, for example, electric conduction work on the getter 30 via the through electrode 20 becomes easy.

Therefore, productivity of the vacuum package 1 can be improved.

In the vacuum package 1, since the thermal conductivity of the substrate 10 is smaller than the thermal conductivity of the through electrode 20, when heating the getter 30 by electric conduction via the through electrodes 20, even if the temperature of the through electrodes 20 is high, it is possible to suppress transfer of heat to surroundings.

Therefore, in the vacuum package 1, the distance L1 between the getter 30 and the element mounting area 40 can be reduced more than that in the related art. Therefore, the external size can be reduced.

In the vacuum package 1, when heating the getter 30 by electric conduction via the through electrodes 20, $le/\lambda eAe$ that is the temperature difference $\Delta T_{BC}$ within the through electrodes 20 generated per unit heat disssipation amount and $1/2 \times l_G/2/\lambda_G A_G$ that is the temperature difference $\Delta T_{AB}$ between the end portion 33 and the center portion 34 of the getter 30 generated per unit heat disssipation amount have a relationship of $le/\lambda eAe < 1/N \times 1/2 \times l_G/2/\lambda_G A_G$.

Therefore, in the vacuum package 1, it is possible to accurately estimate the temperature distribution of the getter 30 and the periphery of the getter 30 by the temperature $T_C$ and the electric conduction current value at the end surface 24 of the second end portion 22 of the through electrode 20 when heating the getter 30.

As a result, in the vacuum package 1, it is possible to reduce the distance L1 between the getter 30 and the element mounting area 40 more than a case where the temperature distribution of the periphery of the getter 30 cannot be accurately estimated. Therefore, the external size can be reduced.

In the vacuum package 1, since N is 30 in $le/\lambda eAe < 1/N \times 1/2 \times l_G/2/\lambda_G A_G$, it is possible to estimate the temperature distribution of the getter 30 and the periphery of the getter 30 more actually, that is, accurately by the temperature $T_C$ and the electric conduction current value at the end surface 24 of the second end portion 22 of the through electrode 20 when heating the getter 30.

Next, a vacuum package of modification examples of the first embodiment will be described.

Modification Example 1

Figure 5:
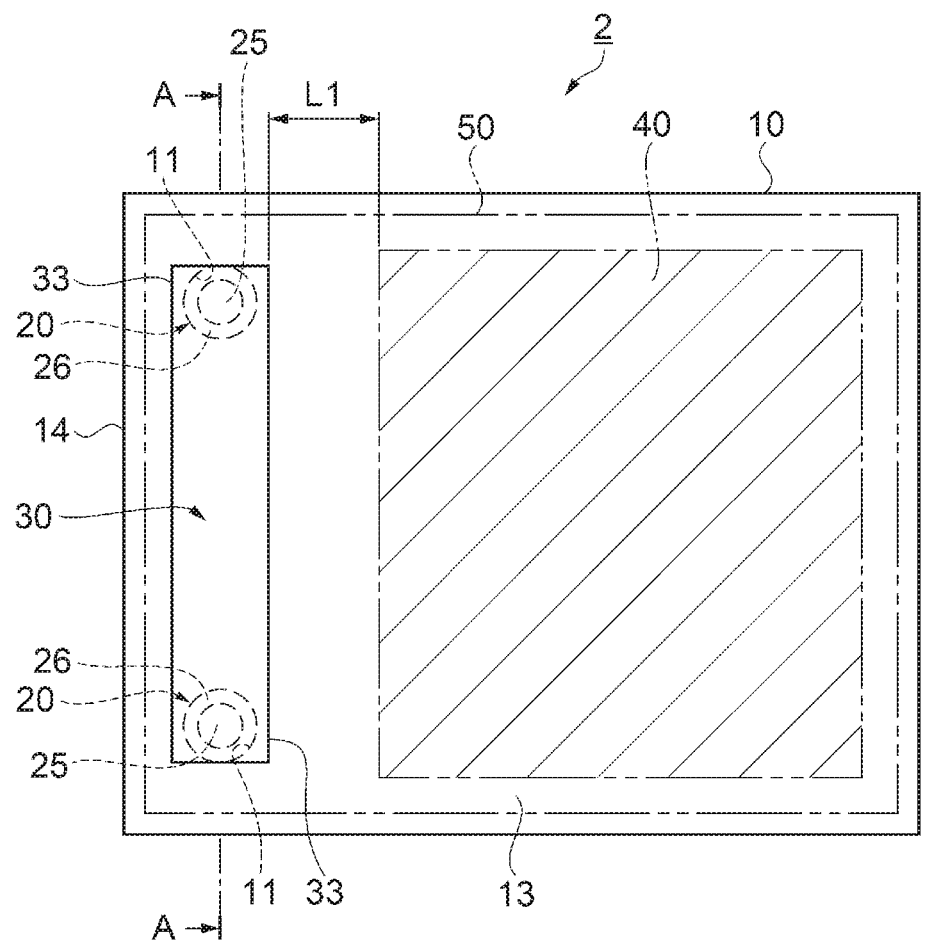
FIG. 5 is a schematic view illustrating a schematic configuration of a vacuum package of Modification Example 1 of the first embodiment and is a plan view in which the vacuum package is viewed from above the same package.
Figure 6:
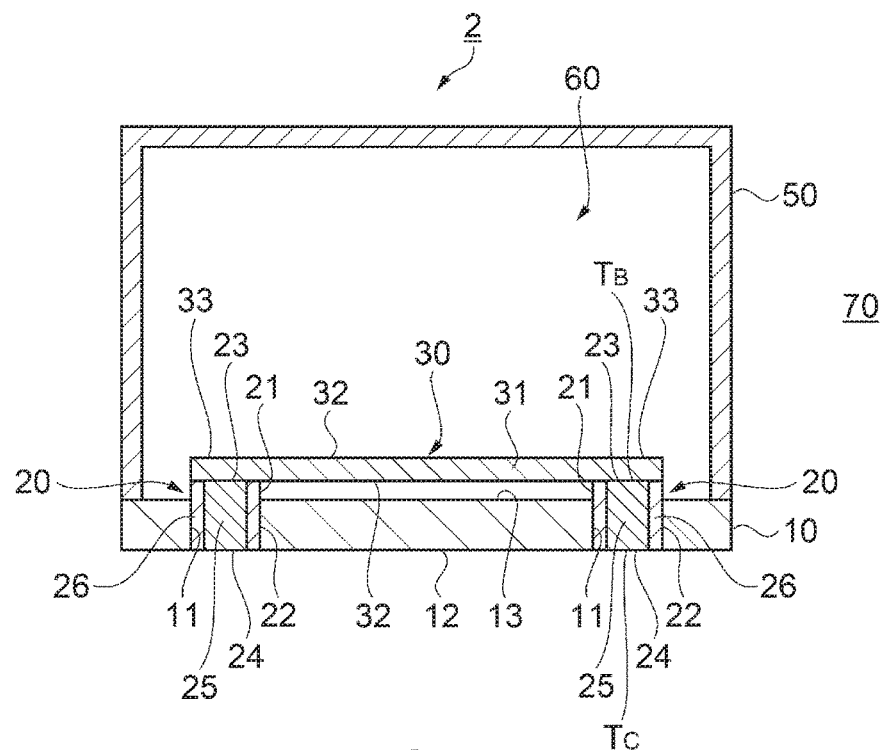
FIG. 6 is a sectional view that is taken along line A-A of FIG. 5.

FIG. 5 is a schematic view illustrating a schematic configuration of a vacuum package of Modification Example 1 of the first embodiment and is a plan view in which the vacuum package is viewed from above the same package. FIG. 6 is a sectional view that is taken along line A-A of FIG. 5. The same reference numerals are given to the common portions to the first embodiment, detailed description thereof will be omitted, and portions different from the first embodiment will be mainly described.

As illustrated in FIGS. 5 and 6, a vacuum package 2 of Modification Example 1 is different from that of the first embodiment in the configuration of the through electrodes 20.

The through electrode 20 of the vacuum package 2 is configured to include a substantially columnar conductor 25 and an insulator 26 that covers a periphery of the conductor 25 in a ring shape in a plan view.

In the vacuum package 2, and the thermal conductivity of the insulator 26 of the through electrode 20 is greater than the thermal conductivity of a substrate 10.

More specifically, in the vacuum package 2, alumina (thermal conductivity: substantially 20 to 40 W/mK) is used for the substrate 10, copper (thermal conductivity: substantially 400 W/mK and electric resistivity: substantially $1.7 \times 10^{-2} \mu\Omega m$) or aluminum (thermal conductivity: substantially 240 W/mK and electric resistivity: substantially $2.7 \times 10^{-2} \mu\Omega m$) is used for the conductor 25 of the through electrode 20, and silicon carbide (silicon carbide) (thermal conductivity: substantially 150 to 200 W/mK) is used for the insulator 26.

In the vacuum package 2, since alumina (thermal conductivity: substantially 20 to 40 W/mK) is used for the substrate 10, the thermal conductivity (substantially 150 to 200 W/mK) of the insulator 26 is greater than the thermal conductivity (substantially 20 to 40 W/mK) of the substrate 10.

As described above, in the vacuum package 2 of Modification Example 1, the through electrodes 20 is configured to include the conductor 25 and the insulator 26 covering the periphery of the conductor 25 in a plan view, and the thermal conductivity (substantially 150 to 200 W/mK) of the insulator 26 is greater than the thermal conductivity (substantially 20 to 40 W/mK) of the substrate 10.

Therefore, in the vacuum package 2, for example, it is possible to reduce a temperature difference $\Delta T_{BC}$ between a temperature $T_B$ of an end surface 23 of a first end portion 21 and a temperature $T_C$ of an end surface 24 of a second end portion 22 of the through electrode 20 when heating the getter 30 while reducing a short circuit between the through electrodes 20 during mounting on an external member.

Therefore, in the vacuum package 2, when heating the getter 30 by electric conduction via the through electrodes 20, it is possible to accurately estimate a temperature distribution of the getter 30 and the periphery of the getter 30 from the temperature $T_C$ and an electric conduction current value at the end surface 24 of the second end portion 22 of the through electrode 20.

As a result, in the vacuum package 2, it is possible to reduce a distance L1 between the getter 30 and the element mounting area 40 more than that in a case where the temperature distribution of the periphery of the getter 30 cannot be accurately estimated. Therefore, the external size can be reduced.

Modification Example 2

Figure 7A:
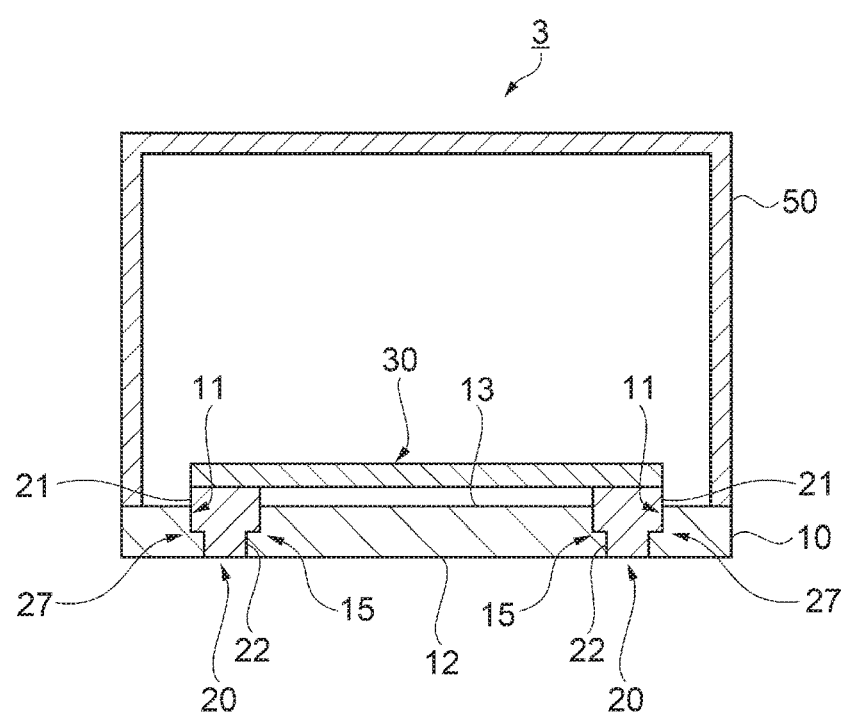
FIG. 7A is a schematic sectional view illustrating a schematic configuration of a vacuum package of Modification Example 2 of the first embodiment.
Figure 7B:
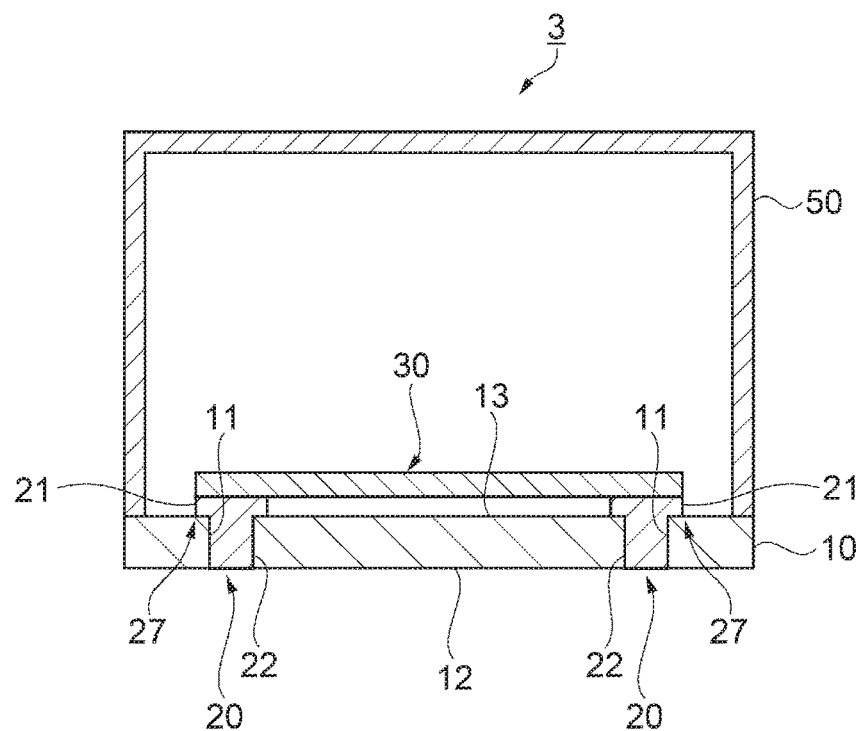
FIG. 7B is a schematic sectional view illustrating schematic configuration of the vacuum package of Modification Example 2 of the first embodiment.

FIGS. 7A and 7B are schematic sectional views illustrating a schematic configuration of a vacuum package of Modification Example 2 of the first embodiment. A sectional position is the same as that in FIG. 2.

The same reference numerals are given to the common portions to the first embodiment, detailed description thereof will be omitted, and portions different from the first embodiment will be mainly described.

As illustrated in FIGS. 7A and 7B, a vacuum package 3 of Modification Example 2 is different from that of the first embodiment in the configuration of an engaging portion of the through electrodes 20 and the substrate 10.

In the vacuum package 3, at least one of the through electrode 20 and the substrate 10 has a stepped portion in the engaging portion of the through electrode 20 and the substrate 10.

In the configuration of FIG. 7A, in the vacuum package 3, both of the through electrode 20 and the substrate 10 have a stepped portion 27 and a stepped position 15 in the engaging portion of the through electrode 20 and the substrate 10.

The stepped portion 27 of the through electrode 20 is formed by forming the through electrode 20 into a stepped columnar shape in which a diameter of the second end portion 22 is smaller than a diameter of the first end portion 21.

The stepped portion 15 of the substrate 10 is formed by forming the through hole 11 into a stepped hole shape in which a diameter on a surface 12 side is smaller than a diameter on a surface 13 side.

In the vacuum package 3 having the configuration of FIG. 7A, the second end portion 22 of the through electrode 20 is inserted from the surface 13 side of the substrate 10 into the through hole 11 and the stepped portion 27 of the through electrode 20 abuts against the stepped position 15 of the substrate 10. Therefore, a position of the through electrode 20 in a penetration direction is determined.

In the configuration of FIG. 7B, in the vacuum package 3, the through electrode 20 has the stepped portion 27 in the engaging portion with the substrate 10.

The stepped portion 27 of the through electrode 20 is formed by forming the through electrode 20 into a stepped columnar shape in which a diameter of the second end portion 22 is smaller than a diameter of the first end portion 21.

The diameter of the through hole 11 of the substrate 10 is set to a size corresponding to the diameter of the through electrode 20 on the second end portion 22 side.

In the vacuum package 3 having the configuration of FIG. 7B, the second end portion 22 of the through electrode 20 is inserted from the surface 13 side of the substrate 10 into the through hole 11 and the stepped portion 27 of the through electrode 20 abuts against the surface 13 of the substrate 10. Therefore, a position of the through electrode 20 in a penetration direction is determined.

As described above, in the vacuum package 3 of Modification Example 2, at least one of the through electrode 20 and the substrate 10 has the stepped portion 27 (15) in the engaging portion of the through electrode 20 and the substrate 10. Therefore, it is possible to reliably perform positioning and falling prevention of the through electrode 20 to the side 12 in the penetration direction.

In the configuration of FIG. 7A, it is possible to lengthen a thick portion of the through electrode 20 more than that of the configuration of FIG. 7B, and in the configuration of FIG. 7B, processing of the through hole 11 of the substrate 10 is easier than that of the configuration of FIG. 7A.

The configuration of each modification example can also be applied to the following second embodiment.

Second Embodiment

Next, a vacuum package of a second embodiment will be described.

Figure 8:
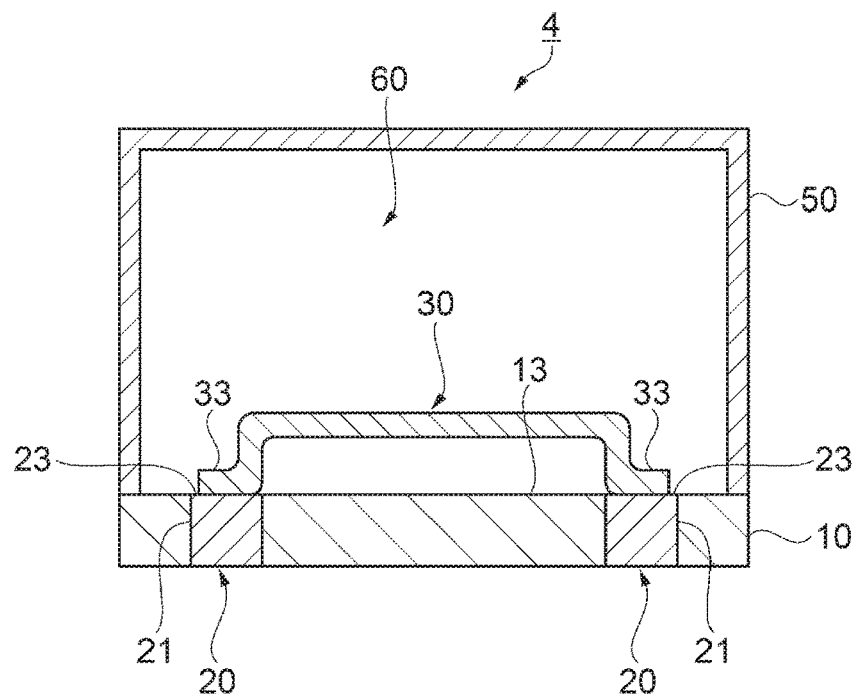
FIG. 8 is a schematic sectional view illustrating a schematic configuration of a vacuum package of a second embodiment.

FIG. 8 is a schematic sectional view illustrating a schematic configuration of a vacuum package of the second embodiment. A sectional position is the same as that in FIG. 2.

The same reference numerals are given to the common portions to the first embodiment, detailed description thereof will be omitted, and portions different from the first embodiment will be mainly described.

As illustrated in FIG. 8, a vacuum package 4 of the second embodiment is different from that of the first embodiment in the configuration of the through electrode 20 and the getter 30.

In the vacuum package 4, a first end portion 21 of the through electrode 20 does not protrude from a substrate 10 to an internal space 60 side and an end surface 23 of a first end portion 21 is flush with a surface 13 of the substrate 10 (in other words, the end surface 23 and the surface 13 are in the same plane).

In the vacuum package 4, the getter 30 extends from an engaging portion of the end portion 33 with the through electrode 20 to an internal space 60 side to be bent, a space is provided between the getter 30 and the substrate 10 between the through electrodes 20, and the getter 30 extends to be bent so as to be substantially parallel to the surface 13 of the substrate 10. In other words, portions including the end portions 33 of the getter 30 are bent in a crank shape.

Therefore, in the vacuum package 4, a portion of the getter 30 between the through electrodes 20 is spaced apart from the substrate 10.

Thus, in the vacuum package 4, since the portion of the getter 30 between the through electrodes 20 is not in direct contact with the substrate 10, heat generated when heating the getter 30 is unlikely to be transferred to the element mounting area 40 (see FIG. 1) on the substrate 10 than that in the related art.

As a result, in the vacuum package 4, the distance L1 (see FIG. 1) between the getter 30 and the element mounting area 40 can be reduced more than that in the related art in a case where the heat sensitivity of the elements to be mounted is the same. Therefore, the external size can be reduced.

In the vacuum package 4, since the getter 30 is bent in the crank shape, it is possible to alleviate thermal stress generated around the getter 30 when heating the getter 30.

In the vacuum package 4, since the getter 30 is bent in the crank shape, it is possible to appropriately adjust an electric conduction distance, a mounting size, and a mounting area of the getter 30.

Figure 9A:
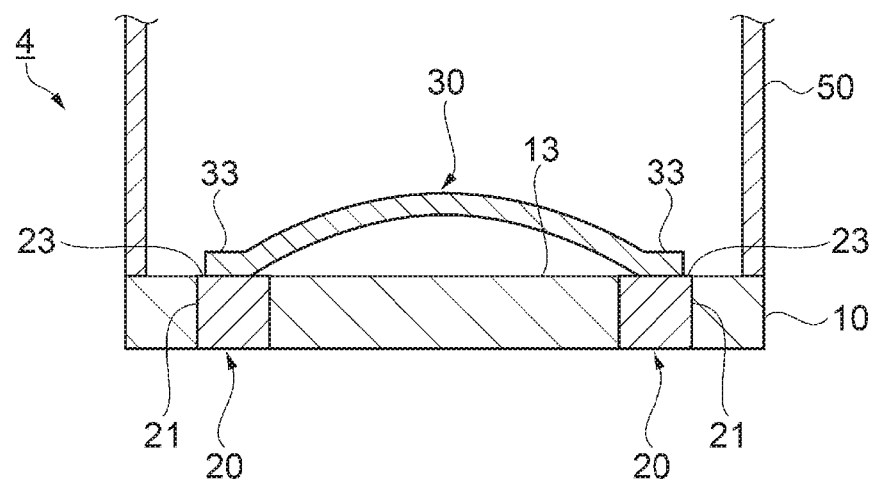
FIG. 9A is a schematic sectional view illustrating a variation of a bent shape of the getter.
Figure 9B:
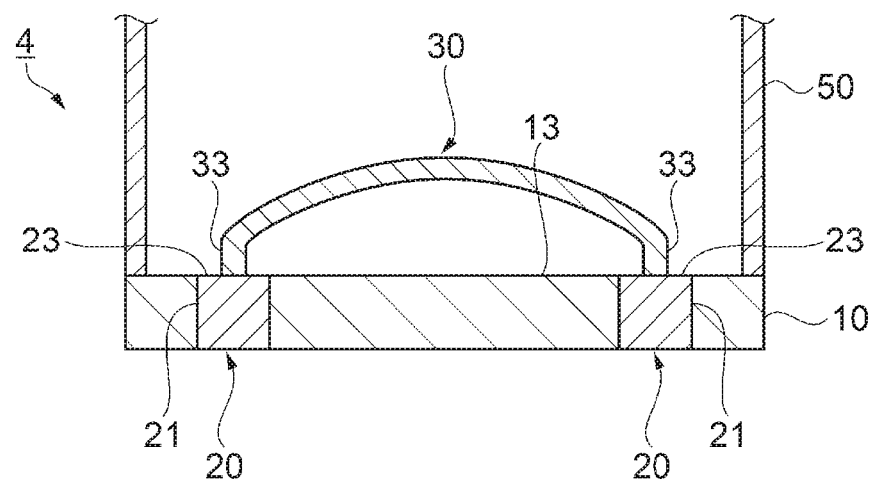
FIG. 9B is a schematic sectional view illustrating a variation of a bent shape of the getter.
Figure 9C:
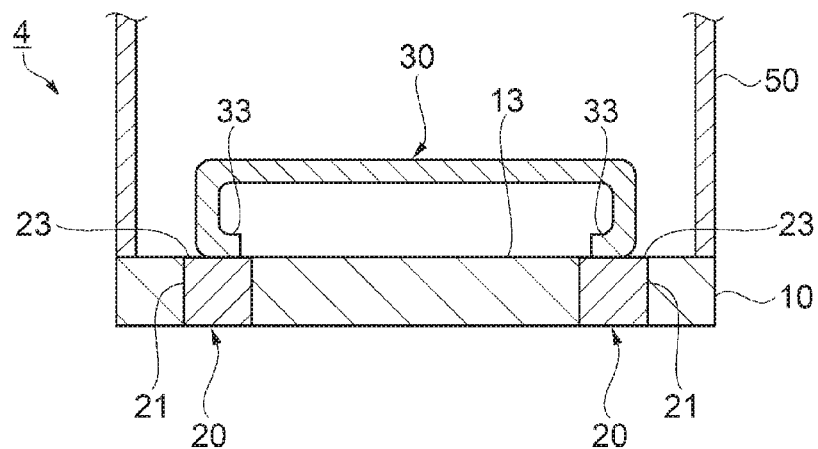
FIG. 9C is a schematic sectional view illustrating a variation of a bent shape of the getter.

The bent shape (sectional shape cut along a longitudinal direction) of the getter 30 is not limited to the shape illustrated in FIG. 8 and may be shapes as illustrated in schematic sectional views illustrating variations of the bent shapes of the getter of FIGS. 9A, 9B, and 9C in a range in which a resistance value is not extremely changed.

More specifically, in FIG. 9A, the portion of the getter 30 between the through electrodes 20 has a bent shape curved in an arch shape. Both end portions 33 of the getter 30 have a flat shape and are more easily and reliably joined to the end surfaces 23 of the first end portions 21 of the through electrodes 20 than a shape of FIG. 9B which is described below.

Similar to FIG. 9A, in FIG. 9B, the portion of the getter 30 between the through electrodes 20 has a bent shape curved in an arch shape. Different from the shape of FIG.

9A, both end portions 33 of the getter 30 are formed to be upright with respect to the end surfaces 23 of the first end portions 21 of the through electrodes 20.

Therefore, the shape of FIG. 9B can make the size of the through electrode 20 smaller than other shapes.

In FIG. 9C, both end portions 33 of the getter 30 are formed so as to be bent toward opposite sides (sides facing each other) with respect to the bent shape of FIG. 8.

Therefore, in the shape of FIG. 9C, it is possible to shorten an entire length of the getter 30 more than that of the shape of FIG. 8 in a case where the electric conduction distance of the getter 30 is the same.

Electronic Device

Next, an electronic device including the vacuum package described above will be described.

Figure 10:
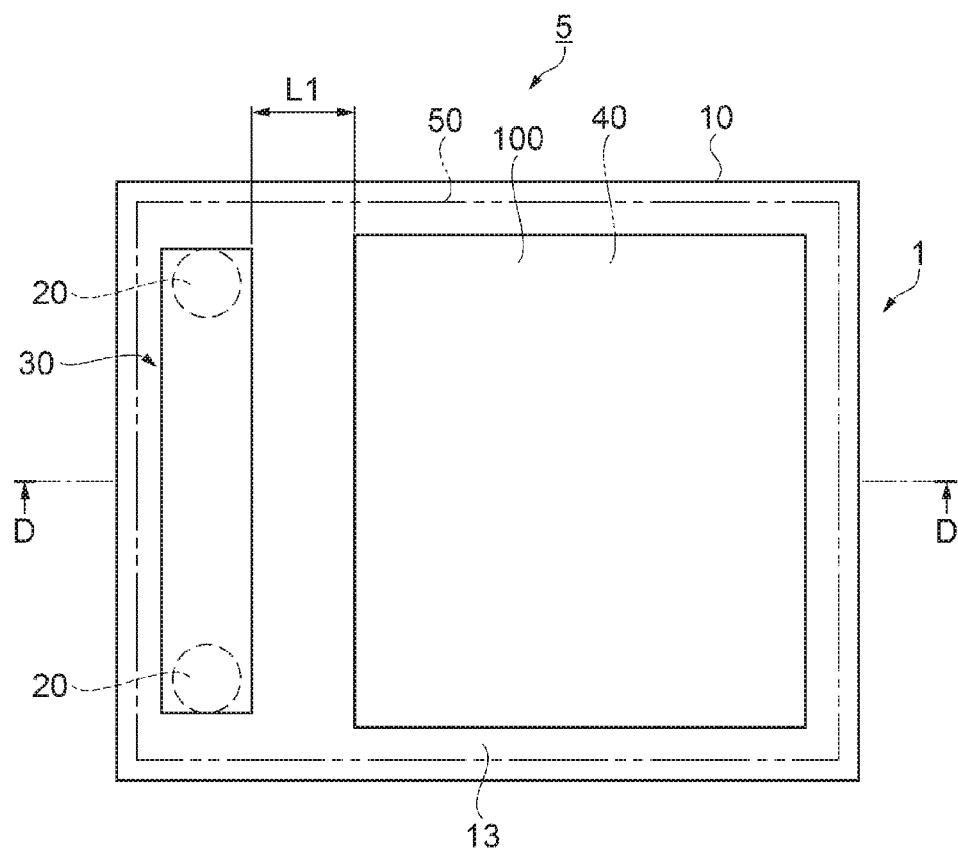
FIG. 10 is a schematic view illustrating a schematic configuration of an electronic device and is a plan view in which the electronic device is viewed from above the same device.
Figure 11:
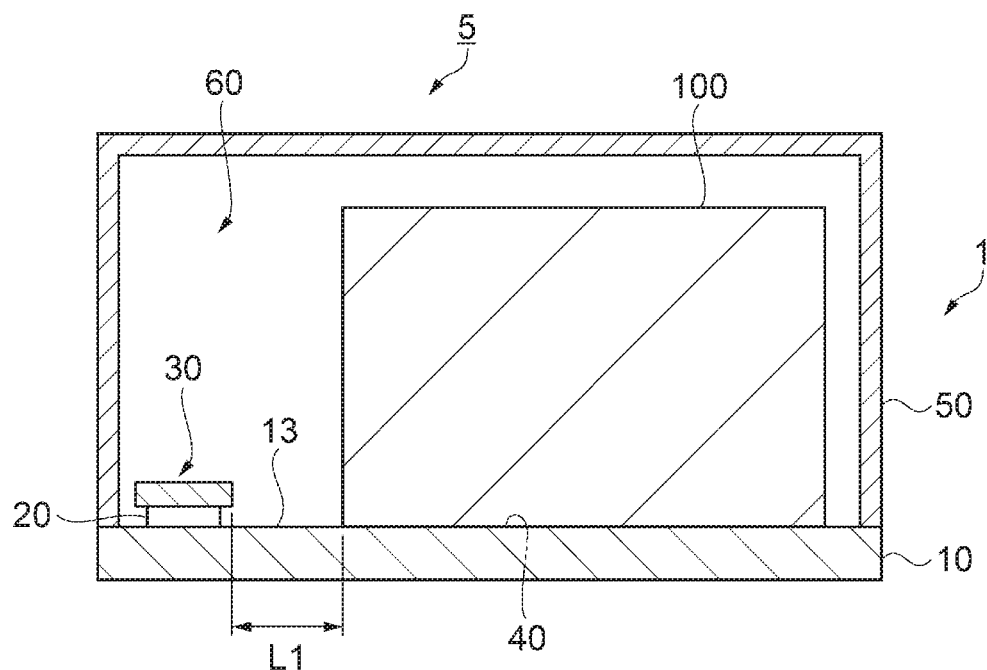
FIG. 11 is a sectional view that is taken along line D-D of FIG. 10.

FIG. 10 is a schematic view illustrating a schematic configuration of the electronic device and is a plan view in which the electronic device is viewed from above the same device. FIG. 11 is a sectional view that is taken along line D-D of FIG. 10.

As illustrated in FIGS. 10 and 11, an electronic device 5 includes one (here, the vacuum package 1 as an example) of the vacuum packages (1 to 4) described above and an element 100 mounted on an element mounting area 40 of a substrate 10 of the vacuum package 1.

The element 100 of the electronic device 5 mounted on the element mounting area 40 is not particularly limited, but, elements having a relatively sensitive to heat, for example, a vibration element, an atomic oscillator element, and an infrared sensor element, are given as examples.

The electronic device 5 functions as an oscillator or a main device of various sensors by mounting the elements 100.

As described above, the electronic device 5 includes one (here, the vacuum package 1) of the vacuum packages (1 to 4) described above and the element 100 mounted on the substrate 10 of the vacuum package 1. Therefore, it is possible to reduce a distance L1 between the getter 30 and the element 100 (element mounting area 40) more than that in the related art.

Therefore, in the electronic device 5, the external size can be reduced.

In addition, in the electronic device 5, it is possible to achieve stabilization of the reduced pressure atmosphere of the internal space 60, improvement of long-term reliability, reduction of deterioration of configuration elements within the vacuum package 1, and the like by the getter 30.

Electronic Apparatus

Next, an electronic apparatus including the electronic device described above will be described.

Figure 12:
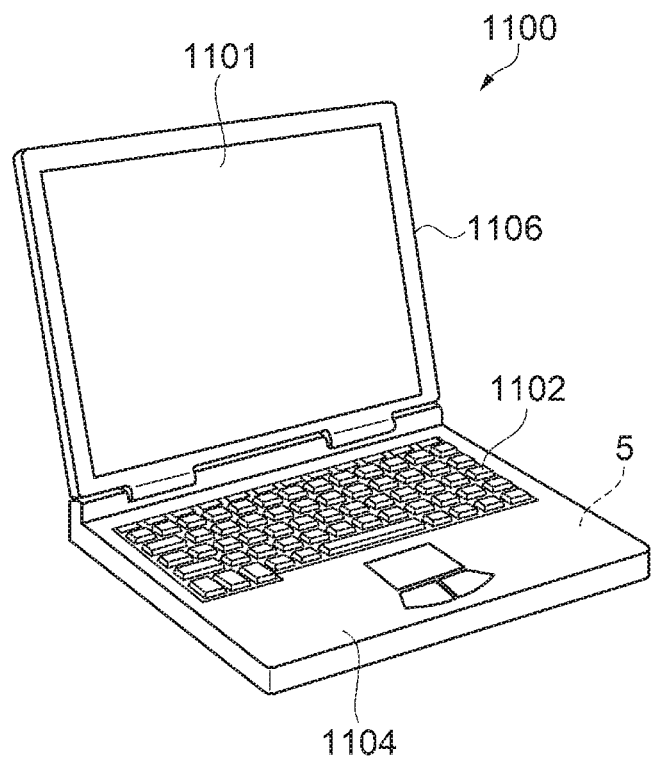
FIG. 12 is a schematic perspective view illustrating a configuration of a personal computer of a mobile type (or notebook type) as an electronic apparatus including the electronic device.

FIG. 12 is a schematic perspective view illustrating a configuration of a personal computer of a mobile type (or notebook type) as the electronic apparatus including the electronic device.

As illustrated in FIG. 12, a personal computer 1100 is configured of a body portion 1104 including a keyboard 1102 and a display unit 1106 including a display portion 1101. The display unit 1106 is rotatably supported to the body portion 1104 via a hinge structure portion.

The electronic device 5 described above is built in such a personal computer 1100.

Figure 13:
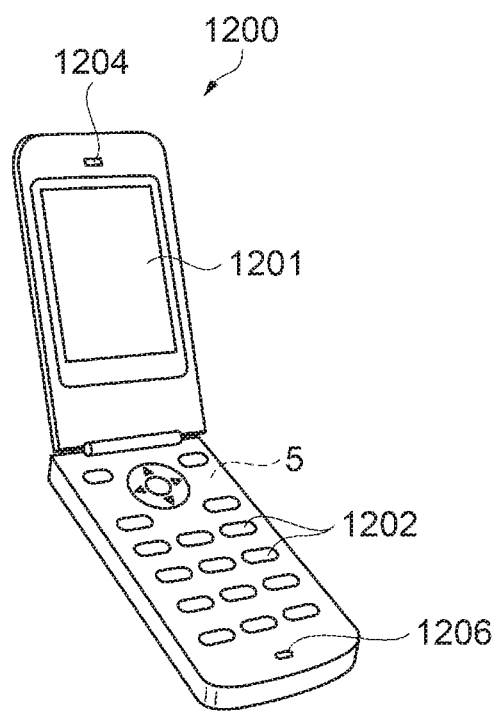
FIG. 13 is a schematic perspective view illustrating a configuration of a mobile phone (also including PHS) as the electronic apparatus including the electronic device.

FIG. 13 is a schematic perspective view illustrating a configuration of a mobile phone (including PHS) as the electronic apparatus including the electronic device.

As illustrated in FIG. 13, a mobile phone 1200 includes a plurality of operation buttons 1202, an earpiece 1204, and a mouthpiece 1206, and a display portion 1201 is disposed between the operation buttons 1202 and the earpiece 1204.

The electronic device 5 is built in such a mobile phone 1200.

Figure 14:
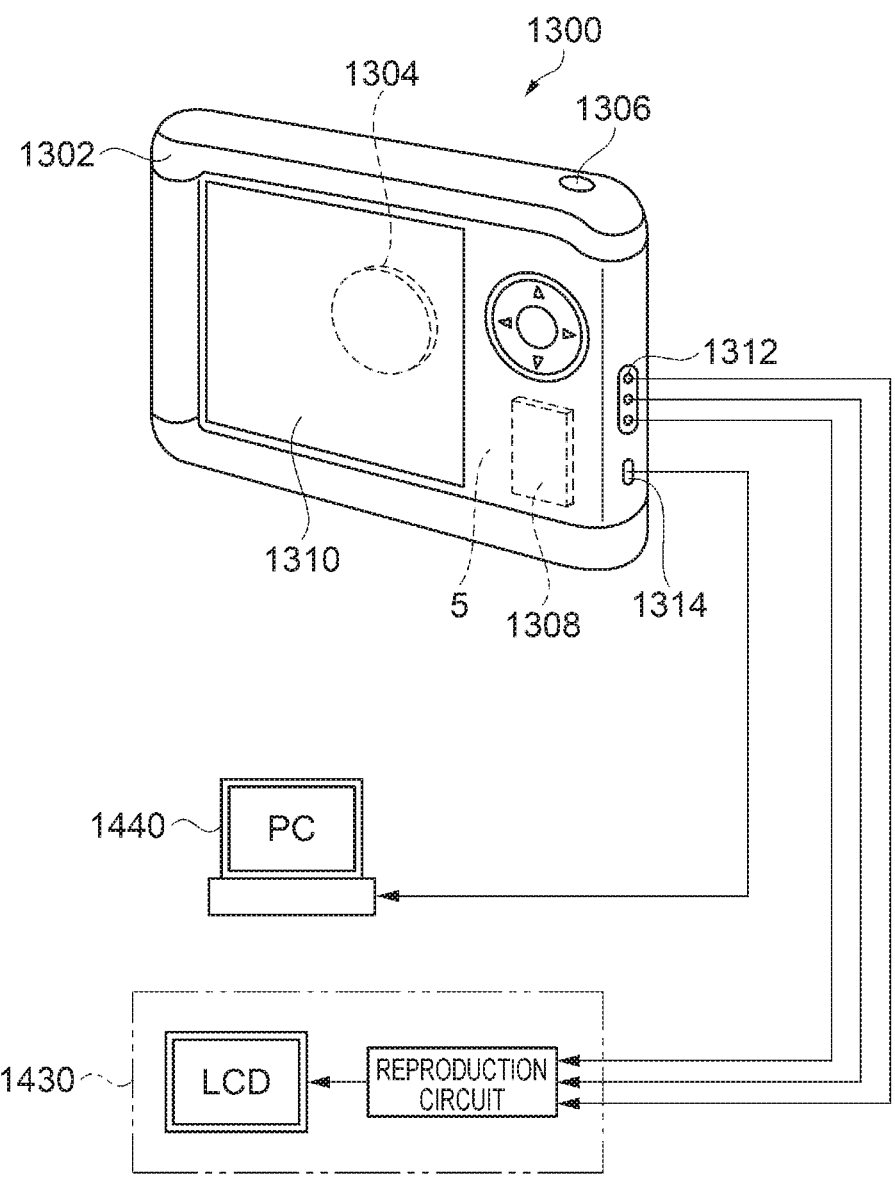
FIG. 14 is a schematic perspective view illustrating a configuration of a digital still camera as the electronic apparatus including the electronic device.

FIG. 14 is a schematic perspective view illustrating a configuration of a digital still camera as the electronic apparatus including the electronic device. In addition, in FIG. 14, connection to an external apparatus is also briefly illustrated.

Here, an ordinary camera exposes a silver salt photographic film to an optical image of an object, whereas a digital still camera 1300 photoelectrically converts the optical image of the object with an image pickup device such as a Charge Coupled Device (CCD) and generates an imaging signal (image signal).

A display portion 1310 is provided on a rear surface (front side in the drawing) of a case (body) 1302 in the digital still camera 1300 and is configured to perform a display based on an imaging signal by CCD. The display portion 1310 functions as a finder that displays the object as an electronic image.

In addition, a light receiving unit 1304 including an optical lens (optical system), the CCD, and the like is provided on a front side (rear surface side in the drawing) of the case 1302.

If a photographer confirms an object image displayed on the display portion 1310 and presses a shutter button 1306, at this time, an imaging signal of the CCD is transferred and stored in a memory 1308.

In addition, in the digital still camera 1300, a video signal output terminal 1312 and a data communication input and output terminal 1314 are provided on a side surface of the case 1302. Therefore, a television monitor 1430 is connected to the video signal output terminal 1312 and a personal computer 1440 is connected to the data communication input and output terminal 1314 if necessary. Furthermore, an imaging signal stored in the memory 1308 is output to the television monitor 1430 or the personal computer 1440 by a predetermined operation.

The electronic device 5 described above is built in such a digital still camera 1300.

Since such an electronic apparatus includes the electronic device 5, the electronic apparatus has the effects described in the embodiments and the modification examples, and can exert excellent performance.

In addition, as the electronic apparatus including the electronic device 5 described above, in addition thereto, for example, an ink jet type ejecting apparatus (for example, an ink jet printer), a laptop personal computer, a television, a video camera, a video tape recorder, various navigation apparatuses, a pager, an electronic diary (also including communication function), an electronic dictionary, an electronic calculator, an electronic game apparatus, a word processor, a workstation, a television telephone, a security television monitor, electronic binoculars, a POS terminal, a medical apparatus (for example, an electronic thermometer, a blood pressure monitor, a blood glucose meter, an electrocardiogram measuring apparatus, an ultrasonic diagnostic apparatus, and an electronic endoscope), a fish finder, various measuring apparatuses, measurement equipment, a flight simulator, a GPS module, a network apparatus, a broadcasting apparatus, and the like are given as examples.

In either case, since the electronic apparatuses include the electronic device 5 described above, the electronic apparatuses have the effects described in the embodiments and the modification examples, and can exert excellent performance.

Vehicle

A vehicle including the electronic device described above will be described.

Figure 15:
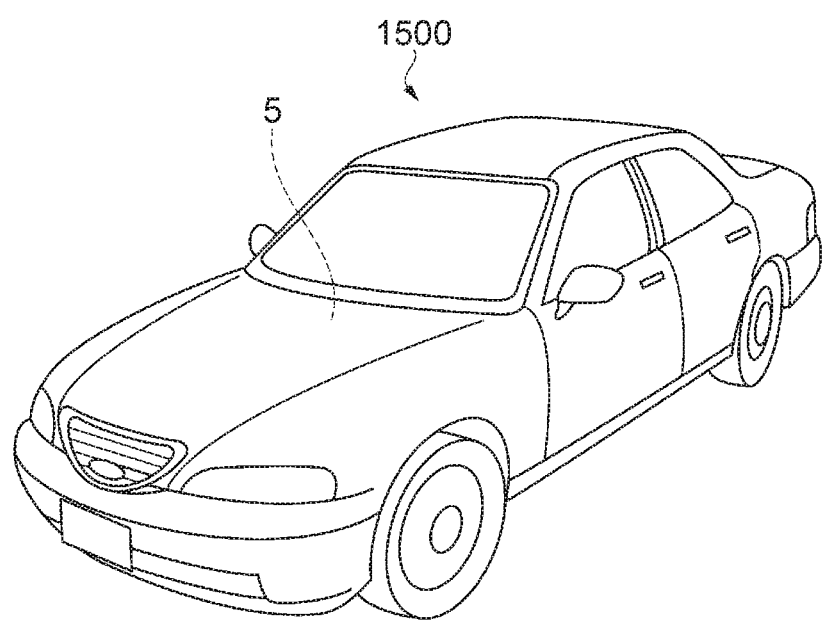
FIG. 15 is a schematic perspective view illustrating an automobile as a vehicle including the electronic device.

FIG. 15 is a schematic perspective view illustrating an automobile as the vehicle including the electronic device.

An automobile 1500 illustrated in FIG. 15 can preferably use the electronic device 5 described above, for example, as a timing device that generates a reference clock of various electronic control devices (for example, electronically controlled fuel injection device, electronically controlled ABS device, electronically controlled constant speed travel device, and the like) to be mounted and can improve reliability, and exert excellent performance.

The electronic device 5 described above is not limited to the automobile 1500 and can be preferably applied as a timing device of a vehicle including a self-propelled robot, a self-propelled conveying device, a train, a ship, an airplane, an artificial satellite and the like, or a main device of various sensors. In either case, it is possible to provide the vehicle which is excellent and has the effects described in the embodiments and the modification examples, and can exert excellent performance.

The invention includes a configuration substantially the same as the configuration described in the above embodiments (for example, a configuration having the same function, method and result, or a configuration having the same object and effect). Further, the invention includes a configuration in which non-essential portions of the configuration described in the embodiments are replaced. Further, the invention includes a configuration that achieves the same operation and effect as the configuration described in the embodiments, or a configuration that can achieve the same object. Further, the invention includes a configuration in which a well-known technique is added to the configuration described in the embodiments.

What is claimed is:

1. A vacuum package comprising:
    a substrate;
    a pair of through electrodes that penetrates the substrate, each of the pair of the through electrodes having first end portion; and
    a getter that is joined to the first end portions of the pair of the through electrodes, and is heated by electronic conduction via the pair of the through electrodes;
    wherein a portion of the getter between the pair of the through electrodes is spaced apart from the substrate.

2. The vacuum package according to claim 1, wherein the first end portions of the pair of the through electrodes protrude from the substrate.

3. The vacuum package according to claim 1, wherein the through electrode comprising a conductor and an insulator that covers a periphery of the conductor, and wherein thermal conductivity of the insulator is greater than thermal conductivity of the substrate.

4. The vacuum package according to claim 1, wherein at least one of the through electrode and the substrate has a stepped portion in an engaging portion between the through electrode and the substrate.

5. The vacuum package according to claim 1, wherein the through electrode has a configuration in which end surface of the second end portion opposite to the first end portion is flush with a surface of the substrate opposite to a surface of the substrate that faces the getter.

6. The vacuum package according to claim 1, wherein the thermal conductivity of the substrate is smaller than the thermal conductivity of the through electrode.

7. The vacuum package according to claim 1, wherein the getter has a base material and an absorbent material that covers at least a part of the base material, and when the getter is heated by electric conduction via the pair of the through electrodes, the following expression is satisfied:

$$le/\lambda e A e < 1/N \times 1/2 \times l_G/2/\lambda_G A_G,$$

where le is a thickness of the through electrode in a substrate penetration direction, $\lambda e$ is the thermal conductivity of the through electrode, Ae is an average sectional area of the through electrode in a plane perpendicular to the penetration direction, $l_G$ is a length of an electric conduction portion of the getter, $\lambda_G$ is a thermal conductivity of the base material of the getter, $A_G$ is an average sectional area of the getter in a plane perpendicular to an electric conduction direction, and N is a real number.

8. The vacuum package according to claim 7, wherein the N is 30.

9. An electronic device comprising:
    the vacuum package according to claim 1; and
    an element that is mounted on the substrate of the vacuum package.

10. A vehicle comprising:
    the electronic device according to claim 1.

* * * * *